(12) United States Patent
Mun et al.

(10) Patent No.: US 11,862,440 B2
(45) Date of Patent: Jan. 2, 2024

(54) SEMICONDUCTOR PROCESSING EQUIPMENT INCLUDING ELECTROSTATIC CHUCK FOR PLASMA PROCESSING

(71) Applicant: SAMSUNG ELECTRONICS CO., LTD., Suwon-si (KR)

(72) Inventors: Jeongil Mun, Hwaseong-si (KR); Jinyoung Park, Anyang-si (KR); Jongwoo Sun, Hwaseong-si (KR); Hyungjoo Lee, Hwaseong-si (KR)

(73) Assignee: Samsung Electronics Co., Ltd.

( * ) Notice: Subject to any disclaimer, the term of this patent is extended or adjusted under 35 U.S.C. 154(b) by 262 days.

(21) Appl. No.: 17/373,214

(22) Filed: Jul. 12, 2021

(65) Prior Publication Data

US 2022/0189746 A1 Jun. 16, 2022

(30) Foreign Application Priority Data

Dec. 16, 2020 (KR) ........................ 10-2020-0176089

(51) Int. Cl.
*H01J 37/32* (2006.01)
*H01L 21/683* (2006.01)

(52) U.S. Cl.
CPC .. *H01J 37/32715* (2013.01); *H01J 37/32541* (2013.01); *H01J 37/32568* (2013.01); *H01L 21/6833* (2013.01); *H01J 37/32697* (2013.01)

(58) Field of Classification Search
CPC ......... H01L 21/68785; H01L 21/67109; H01L 21/67103; H01L 21/68742; H01L 21/6833;

(Continued)

(56) References Cited

U.S. PATENT DOCUMENTS 6,228,438 B1  5/2001 Schmitt
7,948,735 B2  5/2011 Nobori et al.
(Continued)

FOREIGN PATENT DOCUMENTS

JP          3311812 A    5/2002
KR    20190095117 A    8/2019
TW         I466596 B  * 12/2014

OTHER PUBLICATIONS

Machine translation of Son Taiwanese Patent Document TW 1466596 B Dec. 21, 2014 (Year: 2014).*

*Primary Examiner* — Kevin J Comber
(74) *Attorney, Agent, or Firm* — Fish & Richardson P.C.

(57) ABSTRACT

Semiconductor processing equipment and an electrostatic chuck include a semiconductor having: an upper electrode; a gas supplier connected to the upper electrode; and a substrate supporting structure spaced apart from the upper electrode to define a processing volume. The substrate supporting structure supports a substrate and includes: a lower electrode having a side area disposed outside a step formed at an outer perimeter portion of the lower electrode and a processing area disposed inside the step; a first plate disposed on the lower electrode; an attraction electrode disposed on the first plate; and a second plate disposed on the attraction plate. The second plate supports the substrate in a state in which the substrate is laid on an upper surface of the second plate. Each of the first plate and the second plate includes ceramic. The lower electrode has a maximum height at a central portion of the processing area.

18 Claims, 10 Drawing Sheets

(58) Field of Classification Search
CPC ........... H01J 37/32568; H01J 37/32541; H01J 37/32715; H01J 37/32697
USPC ........................................................ 361/234
See application file for complete search history.

(56) References Cited

U.S. PATENT DOCUMENTS

| | | |
|---|---|---|
| 2004/0177927 A1* | 9/2004 | Kikuchi ............ H01J 37/32715 156/345.51 |
| 2009/0243235 A1 | 10/2009 | Nobori et al. |
| 2012/0211165 A1 | 8/2012 | Yoshikawa et al. |
| 2019/0237307 A1 | 8/2019 | Sasaki |
| 2019/0244793 A1 | 8/2019 | Chen et al. |
| 2020/0161157 A1 | 5/2020 | Lee et al. |
| 2021/0175051 A1* | 6/2021 | Matsuyama ...... H01J 37/32724 |

* cited by examiner

SEMICONDUCTOR PROCESSING EQUIPMENT INCLUDING ELECTROSTATIC CHUCK FOR PLASMA PROCESSING

CROSS-REFERENCE TO THE RELATED APPLICATION

This application claims priority from Korean Patent Application No. 10-2020-0176089, filed on Dec. 16, 2020, in the Korean Intellectual Property Office, the disclosure of which is incorporated herein by reference in its entirety.

BACKGROUND

1. Field

The exemplary embodiments of the disclosure relate to an electrostatic chuck for plasma processing and semiconductor processing equipment including the electrostatic chuck.

2. Description of the Related Art

Semiconductor processing equipment for plasma processing may be used to process a semiconductor substrate through schemes including etching, physical vapor deposition (PVD), chemical vapor deposition (CVD), and resist removal. One type of semiconductor processing equipment used in plasma processing includes a reaction chamber including an upper end electrode and a lower end electrode. As radio-frequency (RF) power is applied between the electrodes, a process gas is excited by plasma for processing semiconductor substrates in the reaction chamber. The plasma may contain ions having high kinetic energy. As the potential of a substrate is adjusted, ions charged in plasma stick to a surface of the substrate and are then directed to remove a material (for example, atoms) therefrom.

SUMMARY

The exemplary embodiments of the disclosure provide semiconductor processing equipment capable of minimizing ion tilting in plasma processing.

According to an aspect of the present disclosure, there is provided semiconductor processing equipment. The semiconductor processing equipment includes: an upper electrode; a gas supplier connected to the upper electrode; and a substrate supporting structure spaced apart from the upper electrode to define a processing volume. The substrate supporting structure supports a substrate and includes a lower electrode having a side area disposed outside a step formed at an outer perimeter portion of the lower electrode and a processing area disposed inside the step. A first plate is disposed on the lower electrode, and an attraction electrode is disposed on the first plate. A second plate is disposed on the attraction plate. The second plate supports the substrate in a state in which the substrate is laid on an upper surface of the second plate. Each of the first plate and the second plate includes ceramic. The lower electrode has a maximum height at a central portion of the processing area.

According to an aspect of the present disclosure, there is provided an electrostatic chuck. The electrostatic chuck includes a side area disposed outside a step formed at an outer perimeter portion and a processing area disposed inside the step and having a greater height than the side area. An upper surface of the processing area has a tilt of 0.01 or less. Electric field vectors in different directions are generated in the processing area.

According to an aspect of the present disclosure, there is provided a semiconductor processing equipment. The semiconductor processing equipment includes: a chamber; an upper electrode disposed at a top portion of the chamber; a gas supplier connected to the upper electrode at an outside of the chamber; and a substrate supporting structure spaced apart from the upper electrode in the chamber to define a processing volume. The substrate supporting structure supports a substrate. A vertical rod is disposed at a lower side of the substrate supporting structure and extends through a bottom portion of the chamber. A focus ring is disposed at an edge of the substrate supporting structure. An upper edge ring is disposed at an outer edge of the focus ring. An isolator provides an electrical signal to the substrate supporting structure. A lower edge ring is disposed at a side of the isolator and a lower side of the upper edge ring. A ground plate is connected to the isolator, The substrate supporting structure includes: a lower electrode having a side area disposed outside a step formed at an outer perimeter portion of the lower electrode and a processing area disposed inside the step; a first plate disposed on the lower electrode; an attraction electrode disposed on the first plate; and a second plate disposed on the attraction plate. The second plate supports the substrate in a state in which the substrate is laid on an upper surface of the second plate. Each of the first plate and the second plate includes ceramic. The lower electrode has a maximum height at a central portion of the processing area.

DETAILED DESCRIPTION OF EXEMPLARY EMBODIMENTS

Figure 1:
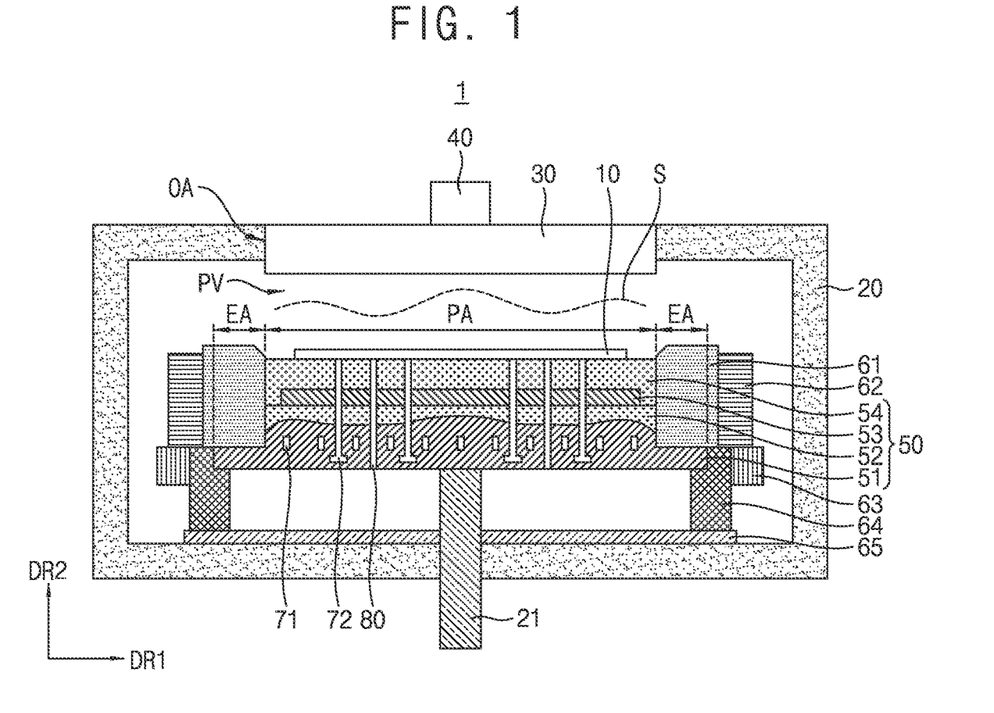
FIG. 1 is a schematic sectional view showing semiconductor processing equipment according to an exemplary embodiment of the disclosure.
Figure 2:
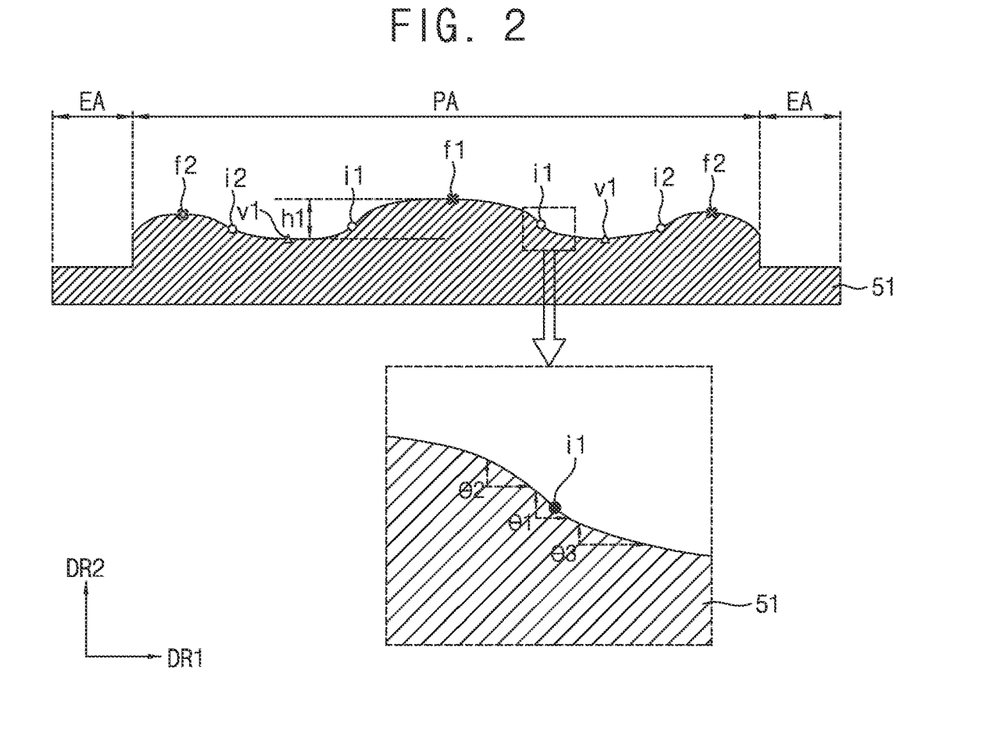
FIG. 2 is a view explaining a lower electrode of FIG. 1.

FIG. 1 is a schematic sectional view showing semiconductor processing equipment according to an exemplary embodiment of the disclosure. FIG. 2 is a view explaining a lower electrode of FIG. 1.

The size and thickness of each constituent element shown in the drawings are given merely for convenience of description, and exemplary embodiments of the disclosure are not limited thereto. Thicknesses of various layers and regions may be exaggerated in order to clearly express the layers and regions.

In the specification, one direction of horizontal directions (width directions or lateral directions) is defined as a first direction DR1 and one direction of vertical directions (thickness directions or height directions) crossing the first direction DR1 is defined as a second direction DR2.

Referring to FIGS. 1 and 2, semiconductor processing equipment 1 may be used for a semiconductor process for processing substrates 10 such as semiconductor wafers. For example, the semiconductor process may include chemical vapor deposition (CVD), atomic layer deposition (ALD), conductor etching, dielectric etching, rapid thermal processing (RTP), ion implantation and physical vapor deposition (PVD), and/or other etching processes, a deposition process or a cleaning process. In the semiconductor process, gas mixtures may be introduced into a chamber 20 of the semiconductor processing equipment 1 and plasma may be used to initiate and sustain chemical reactions.

In an embodiment, the semiconductor processing equipment 1 may include the chamber 20, an upper electrode 30 disposed at a top portion of the chamber 20, a substrate supporting structure 50 disposed in an interior of the chamber 20, a vertical rod 21 supporting the substrate supporting structure 50, a side structure 61 to 65 disposed adjacent to the substrate supporting structure 50, and a gas supplier 40 disposed outside the chamber 20. The substrate supporting structure 50 may include a lower electrode 51, a first plate 52, an attraction electrode 53, and a second plate 54. The side structure 61 to 65 may include a focus ring 61, an upper edge ring 62, a lower edge ring 63, an isolator 64, and a ground plate 65.

In an embodiment, the chamber 20 may have a substantially cylindrical shape. For example, an inner surface of the chamber 20 may be in a state of being subjected to alumite treatment (anodization). The interior of the chamber 20 may include a function of a processing chamber in which plasma processing such as an etching process, etc. is performed by plasma.

In an embodiment, the chamber 20 may include, at one side thereof (for example, a top side), an opening area OA in which the upper electrode 30 may be disposed. The upper electrode 30 may be disposed in the opening area OA such that the upper electrode 30 closes the chamber 20. An edge of the upper electrode 30 may be surrounded by the chamber 20. Although not clearly shown, an insulating material may be interposed between the upper electrode 30 and the chamber 20. In some embodiments, the upper electrode 30 may be grounded. A lower surface of the upper electrode 30 may be flat.

The upper electrode 30 may be connected to the gas supplier 40. In this case, the gas supplier 40 may supply a gas to the interior of the chamber 20 through the upper electrode 30. The upper electrode 30 may receive the gas and may diffuse the received gas. For example, the upper electrode 30 may form a plasma sheath S having a center peak in a processing volume PV above a substrate 10. In another example, the upper electrode 30 may form a plasma sheath S having a center peak and a plasma density peak in an edge region of the substrate 10 (for example, a region spaced apart from a center by 80 to 150 mm) (an edge peak). Here, the processing volume PV is defined by a space between the substrate supporting structure 50 and the upper electrode 30 and includes a space in which the substrate 10 is disposed. FIG. 1 illustrates an example in which, in a semiconductor process, plasma forms a plasma sheath having a center peak and a density peak in the edge region (an edge peak).

That is, the plasma may have different densities in the processing volume PV in accordance with positions thereof from a center thereof. Due to non-uniformity of plasma density, for example, an etching rate may be variable between the center of the substrate 10 and an outer perimeter of the substrate 10. Furthermore, due to non-uniformity of plasma density, for example, sheath bending and ion incidence angle tilt at the outer perimeter of the substrate may cause high aspect ratio contact (HARC) profile tilt.

In the substrate supporting structure 50, the lower electrode 51, the first plate 52, the attraction electrode 53 and the second plate 54 may be disposed in the second direction DR2 in this order.

The lower electrode 51 may be an electrostatic chuck (ESC). When a DC voltage or a high-voltage (HV) voltage is applied, the lower electrode 51 may cause the substrate 10 to be attracted toward the lower electrode 51 by Coulomb force and may maintain the substrate 10 in the attracted state.

A step may be provided at an outer perimeter portion of the lower electrode 51. The lower electrode 51 may be divided into a processing area PA and a side area EA disposed inside and outside the step of the outer perimeter portion, respectively. For example, in the lower electrode 51, the height (thickness) of the processing area PA may be greater than the thickness of the side area EA. An angle of a wall formed by the step of the lower electrode 51 may be 80 to 90°.

The processing area PA may overlap with an area where the substrate 10 is laid. An upper surface of the processing area PA may not be flat, but may be curved. That is, the upper surface of the processing area PA in the lower electrode 51 may include a curved surface. The side area EA may be an area where the focus ring 61 is mounted.

In an embodiment, the upper surface of the processing area PA may have a shape similar to that of the plasma sheath S. For example, the shape of the upper surface of the processing area PA may be formed to have the same shape as the plasma sheath S. That is, in an embodiment, the upper surface of the processing area PA may have a first peak f1 and a second peak f2 respectively corresponding to a center peak and an edge peak. For example, the first peak f1 corresponds to a central portion of the processing area PA and the second peak f2 is disposed in an area adjacent to an edge of the processing area PA. For example, although not clearly shown, the first peak f1 may have the form of a point on a plane and the second peak f2 may have the form of a circle surrounding the point when viewed in a plan view. Each of the first peak f1 and the second peak f2 may have a maximum height in an area adjacent thereto (within a fine distance δ). In an embodiment, the height of the first peak f1 may be greater than the height of the second peak f2. That is, the height of the lower electrode 51 may be maximized at a central portion thereof.

The upper surface of the processing area PA may include a valley v1 disposed between the first peak f1 and the second peak f2. Although not clearly shown, the valley v1 may have the form of a circle disposed between the first peak f1 having the form of a point and the second peak f2 having the form of a circle. The valley v1 may have a minimum height in an area adjacent thereto (within a fine distance δ). For example, a height difference hl between the first peak f1 and the valley v1 may be 0.2 mm or less.

The upper surface of the processing area PA may include a first inflection point i1 disposed between the first peak f1 and the valley v1 and a second inflection point i2 disposed between the second peak f2 and the valley v1. Each of the inflection points i1 and i2 may be defined by a position where the sign of a bending moment of the upper surface of the processing area PA is varied.

In an embodiment, a tilt (for example, θ1, θ2 or θ3) of the upper surface of the lower electrode 51 may be 0.01 or less in all portions of the processing area PA. For example, the upper surface of the lower electrode 51 may have a maximum tilt (for example, θ1) at the first inflection point i1 or the second inflection point i2, but may have a tilt (for example, θ1, θ2 or θ3) of 0.01 or less at the first inflection point i1, the second inflection point, and points adjacent thereto.

The first plate 52 may be disposed on the lower electrode 51. In an embodiment, the first plate 52 may be disposed throughout the entire surface of the processing area PA. An upper surface of the first plate 52 may be flat. Of course, a lower surface of the first plate 52 may be curved. The first plate 52 may have different thicknesses in accordance with positions thereof inside the step, due to the curved shape of the processing area PA of the lower electrode 51 disposed under the first plate 52. For example, in an embodiment, the lower surface of the first plate 52 in an area overlapping with the processing area PA may be a curved surface. In addition, the thickness of the first plate 52 may be minimized in a portion overlapping with the first peak f1 (for example, a central portion) from among portions of the area overlapping with the processing area PA.

For example, the first plate 52 may include a dielectric material. For example, the dielectric material may include ceramic, aluminum oxide ($Al_2O_3$), etc. Although not shown, the first plate 52 may include a heating layer such as a multi-zone heating plate.

An attraction electrode 53 may be disposed on the first plate 52. The attraction plate 53 may be disposed inside the step of the first plate 52 and may overlap with the processing area PA of the lower electrode 51.

In an embodiment, the attraction electrode 53 may generate electrostatic force causing the substrate 10 to be attracted to the substrate supporting structure 50. A DC voltage for attracting the substrate 10 may be applied to the attraction electrode 53.

For example, the attraction electrode 53 may be a composite ceramic including aluminum oxide ($Al_2O_3$) and a conductive material. The attraction electrode 53 may include an alumina titanium carbide material (an AlTiC material) as the conductive material.

The second plate 54 may be disposed on the attraction electrode 53. The second plate 54 may cover the attraction electrode 53 together with the first plate 52. An edge portion of a lower surface of the second plate 54 may contact the first plate 52. The second plate 54 may surround an upper surface and an edge of the attraction electrode 53. An upper surface of the second plate 54 may be flat.

For example, the second plate 54 may include the same material as the first plate 52. Although not shown, the second plate 54 may include a heating layer such as a multi-zone heating plate, similarly to the first plate 52.

The substrate 10 may be laid on the upper surface of the second plate 54. The upper surface of the second plate 54 may face the upper electrode 30.

In an embodiment, the substrate supporting structure 50 may include a plurality of first channels 71 and second channels 72 therein. For example, each first channel 71 is configured to allow a refrigerant to flow therethrough. The refrigerant may be supplied from a supply source to each first channel 71. For example, as the refrigerant, a gas such as helium (He), nitrogen ($N_2$), etc., water, a dedicated organic solvent, etc. may be used. The substrate supporting structure 50 may cool the substrate 10 attracted to the upper surface thereof by the refrigerant flowing through the first channels 71. For example, each second channel 72 may be configured to allow helium (He) to flow therethrough.

In an embodiment, each first channel 71 and each second channel 72 may be disposed in the lower electrode 51. In an embodiment, the plurality of first channels 71 may have the same vertical width (height or thickness). In accordance with embodiments, each first channel 71 and each second channel 72 may be formed in the first plate 52 or the second plate 54, or may be formed to extend through the lower electrode 51, the first plate 52, and the second plate 54.

In an embodiment, each second channel 72 may be connected to a channel hole extending through the first plate 52, the attraction electrode 53, and the second plate 54. The channel hole may be exposed to an outside of the substrate supporting structure 50 at the upper surface of the second plate 54. Although not clearly shown, a part of the first channels 71 may be connected to a discharge hole communicating with a lower side of the lower electrode 51.

In an embodiment, the substrate supporting structure 50 may further include a lift pin 80 extending through the lower electrode 51, the first plate 52, the attraction electrode 53, and the second plate 54. The lift pin 80 includes a function for vertically moving the substrate 10 disposed on the substrate supporting structure 50.

The vertical rod 21 may be disposed at a lower side of the substrate supporting structure 50 and may support the substrate supporting structure 50. The vertical rod 21 may be disposed to extend through a bottom portion of the chamber 20. In an embodiment, the vertical rod 21 may provide radio-frequency (RF) power to the lower electrode 51. In accordance with embodiments, the vertical rod 21 may be configured to be rotatable.

The focus ring 61 may be disposed on the lower electrode 51 in the side area EA of the lower electrode 51. The focus ring 61 may be disposed to surround the first plate 52 and the second plate 54 at side edges of the first plate 52 and the second plate 54 (in the first direction DR1).

The focus ring 61 may have a ring shape surrounding the periphery of the substrate 10. For example, the focus ring 61 may include silicon and may converge plasma toward a surface of the substrate 10, thereby enhancing the efficiency of plasma processing. In an embodiment, the focus ring 61 may be formed to have a greater height than the second plate 54.

The upper edge ring 62 may be disposed outside the focus ring 61. The upper edge ring 62 may be disposed to surround the focus ring 61. For example, the upper edge ring 62 may be a machined product including quartz (QTZ).

The ground plate 65 may be disposed at one side (for example, a lower side) of the interior of the chamber 20. An isolator 64 may be disposed between the ground plate 65 and the lower electrode 51. The isolator 64 may include power supply lines therein. The isolator 64 may provide an electrical signal to the substrate supporting structure 50 (for example, the lower electrode 51). In an embodiment, the isolator 64 may contact parts of edge portions of side and lower surfaces of the lower electrode 51. In accordance with embodiments, the isolator 64 may support the lower electrode 51.

The lower edge ring 63 may be disposed at a lower side of the upper edge ring 62 and an outer edge of the isolator 64. For example, the lower edge ring 63 may be a machined product including quartz (QTZ), similarly to the upper edge ring 62.

Figure 3:
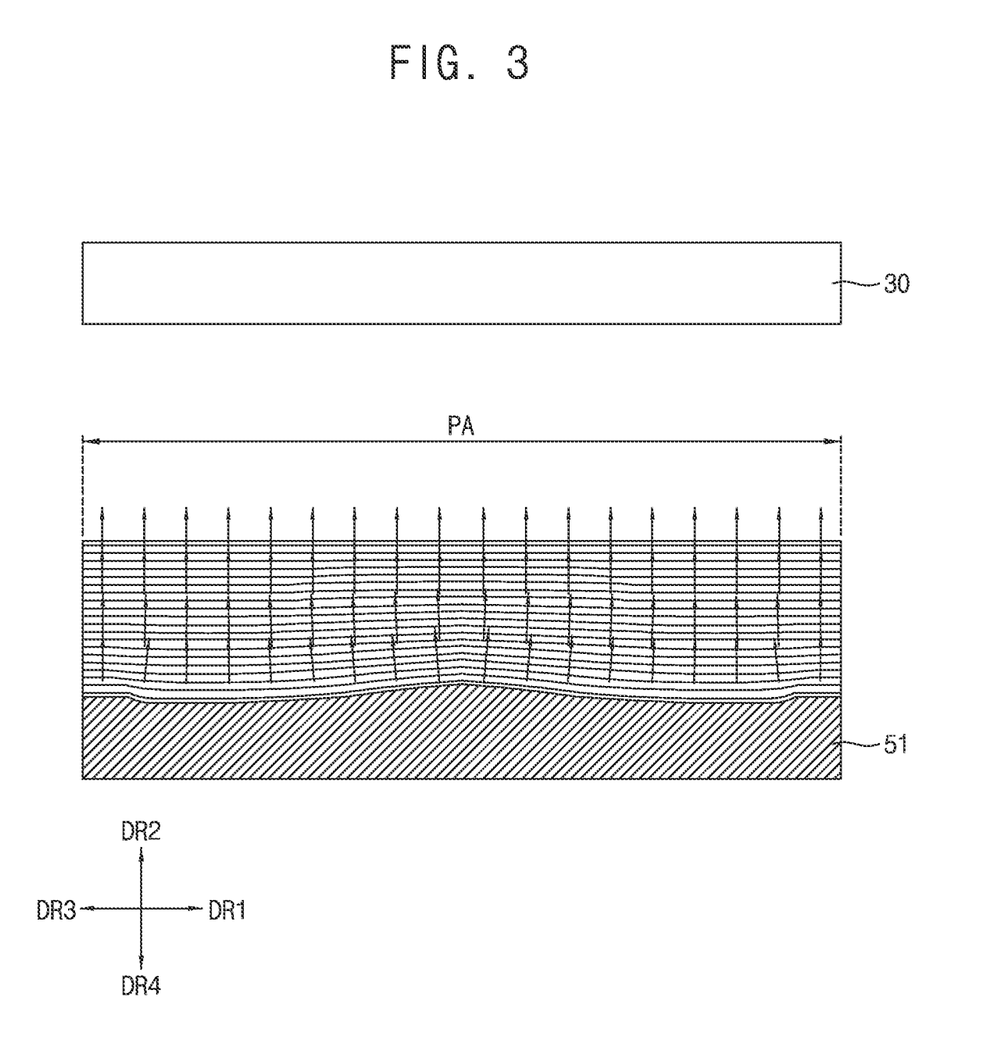
FIG. 3 is a view explaining the concept of an electric field generated from a lower electrode according to an exemplary embodiment of the disclosure.
Figure 4:
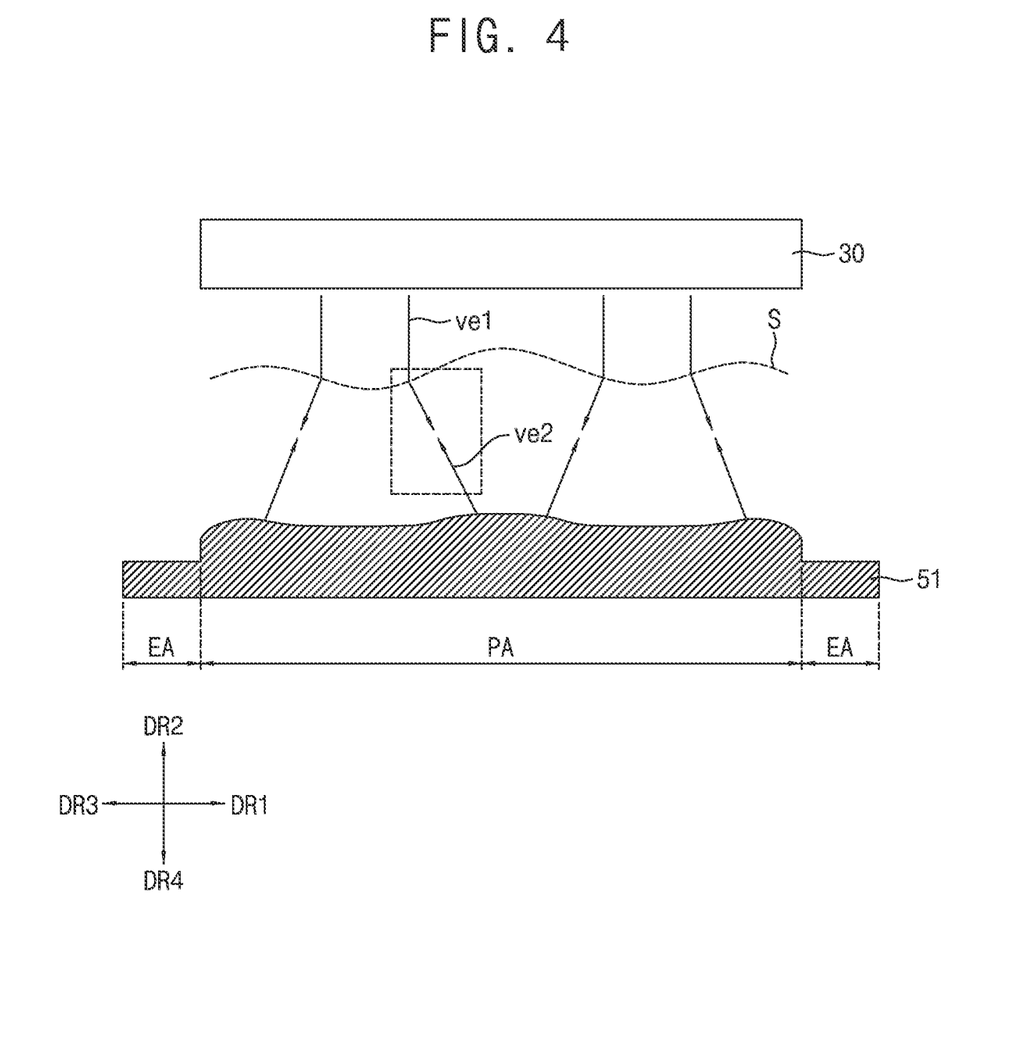
FIG. 4 is a view explaining a profile in semiconductor processing equipment according to an exemplary embodiment of the disclosure.
Figure 5:
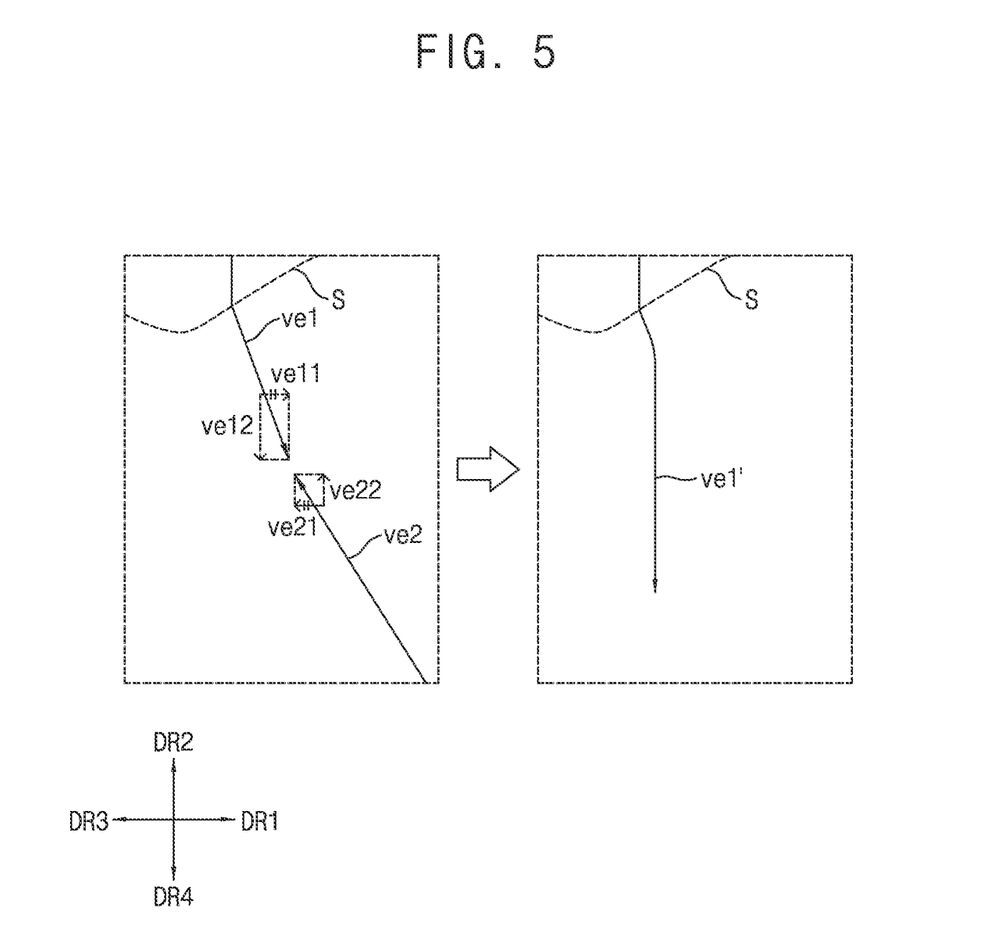
FIG. 5 is a view explaining relation between an electric field vector and an ion incidence vector generated from a lower electrode in semiconductor processing equipment according to an exemplary embodiment of the disclosure.

FIG. 3 is a view explaining the concept of an electric field generated from a lower electrode according to an exemplary embodiment of the disclosure. FIG. 4 is a view explaining a profile in semiconductor processing equipment according to an exemplary embodiment of the disclosure. FIG. 5 is a view explaining relation between an electric field vector and an ion incidence vector generated from a lower electrode in semiconductor processing equipment according to an exemplary embodiment of the disclosure. FIG. 3 shows a portion of the processing area PA of the lower electrode 30. Each view of FIG. 5 is an enlarged view of a portion A of FIG. 4.

For convenience of description, a direction opposite to the first direction DR1 is defined as a third direction DR3 and a direction opposite to the second direction DR2 is defined as a fourth direction DR4. That is, although the first direction DR1 represents a right side, the second direction DR2 an upward side, the third direction DR3 a left side, and the fourth direction DR4 a downward side, when viewed in the drawings, the first to fourth directions DR1 to DR4 may be understood as relative directions, without being limited to the above-described conditions. In addition, the first direction DR1 and the third direction DR3 are defined as corresponding to x-axis components and the second direction DR2 and the fourth direction DR4 are defined as corresponding to z-axis components.

Referring to FIGS. 1 to 5, an electric field, which is generated from the lower electrode 51, may be generated in a zone contacting the upper surface of the lower electrode 51 (the upper surface of the processing area PA) and a zone closely adjacent to the upper surface of the lower electrode 51 in a direction normal to the upper surface of the lower electrode 51. The electric field may be represented by a vector component having both a direction and a magnitude. In the following description, the vector component will be referred to as an "electric field vector ve2". For example, a plurality of electric field vectors ve2 generated from the lower electrode 51 may be formed in a tilted direction between the first direction DR1 and the second direction DR2, in a tilted direction between the third direction DR3 and the second direction DR2 or in the second direction DR2 in a zone contacting the upper surface of the lower electrode 51 and a zone closely adjacent to the upper surface of the lower electrode 51. The electric field generated from the lower electrode 51 may be formed in a direction gradually approximate to the second direction DR2 as the electric field extends gradually from the upper surface of the lower electrode 51 to a predetermined position.

The following description will be given in conjunction with an example in which an ion incidence vector ve1 is tilted in a tilted direction between the first direction DR1 and the fourth direction DR4 in a zone adjacent to a plasma sheath S. In addition, although the ion incidence vector ve1 is practically determined by a sum of vectors of three-dimensional components (x, y and z-axis components), the ion incidence vector ve1 will be described with reference to vectors of two-dimensional components (x and y-axis components).

An ion incidence vector ve1 to advance in a z-axis direction (the fourth direction DR4) may be tilted due to non-uniform density of plasma. For example, the direction of the ion incidence vector ve1 may be determined by a direction represented by a sum of a vector magnitude in the fourth direction DR4 and a vector magnitude in the first direction DR1.

In an embodiment, the direction of the electric field vector ve2 generated from the lower electrode 51 may face the ion incidence vector ve1. For example, the z-axis magnitude of an electric field generated from the lower electrode 51 (for example, a vector component in the second direction DR2) may be smaller than the z-axis magnitude of an ion (for example, a vector component in the fourth direction DR4). In addition, for example, the x-axis magnitude of the electric field generated from the lower electrode 51 (for example, a vector component in the third direction DR3) may be equal to the x-axis magnitude of the ion (for example, a vector component in the first direction DR1).

A final ion incidence vector ve1' reaching the substrate 10 may be adjusted in accordance with the following Expression 1:

$$ve1' = ve1 + ve2 = ve11 + ve12 + ve21 + ve22 \qquad \text{[Expression 1]}$$

In such a manner, an x-axis component of the ion incidence vector ve1 may be offset by an electric field vector ve2 generated from the lower electrode 51. Although not shown, a y-axis component of the ion incidence vector ve1 may also be offset by an electric field vector ve2 generated from the lower electrode 51 in a manner similar to the above-described manner. As a result, only a z-axis component of the ion incidence vector ve1 (a component in the fourth direction DR4) may remain. Accordingly, the tilt angle of the final ion incidence vector ve1' in an x-axis direction and/or a y-axis direction may be minimized That is, the direction of the final ion incidence vector ve1' may be substantially a z-axis direction (the fourth direction DR4).

Figure 6:
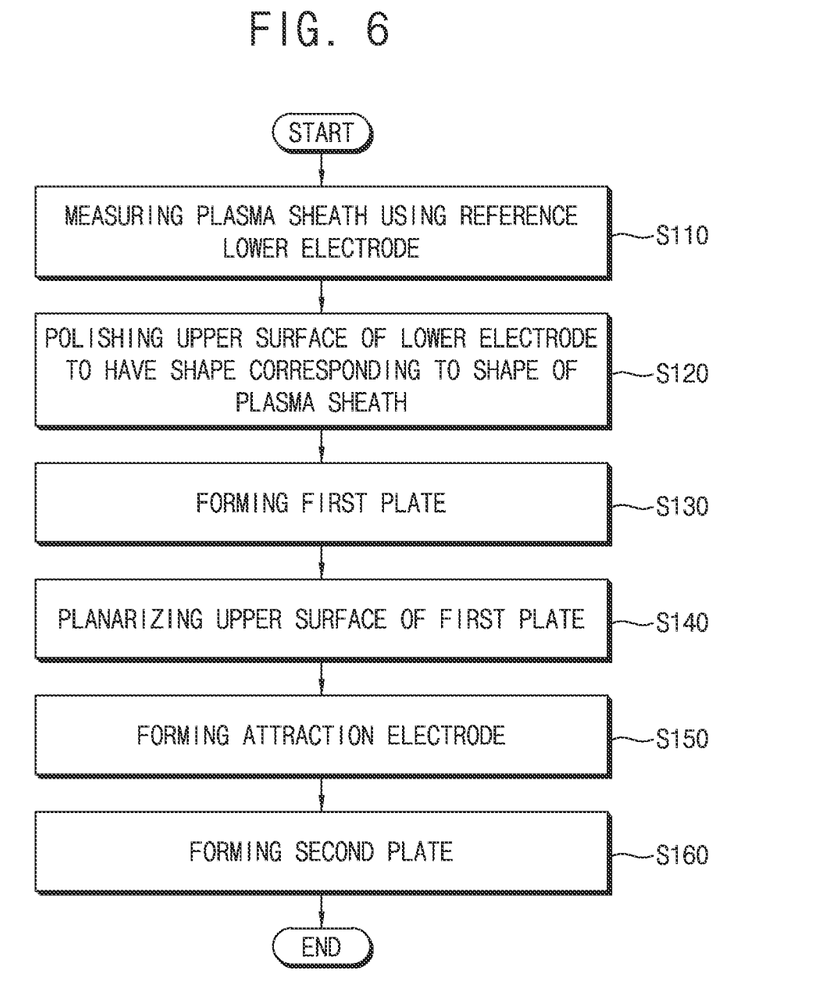
FIG. 6 is a flowchart explaining a method for manufacturing semiconductor processing equipment in accordance with an exemplary embodiment of the disclosure.

FIG. 6 is a flowchart explaining a method for manufacturing semiconductor processing equipment in accordance with an exemplary embodiment of the disclosure. FIGS. 7 to 10 are views explaining a part of procedures of FIG. 6. The following description will be given mainly in conjunction with a method for manufacturing the substrate supporting structure 50 of the semiconductor processing equipment 1.

Referring to FIGS. 6 to 10, the method for manufacturing the semiconductor processing equipment 1 may include measuring a plasma sheath using a reference lower electrode (S110), polishing an upper surface of the reference lower electrode such that the upper surface has a shape corresponding to a shape of the plasma sheath (S120), forming a first plate (S130), planarizing an upper surface of the first plate (S140), forming an attraction electrode (S150), and forming a second plate (S160).

Figure 7:
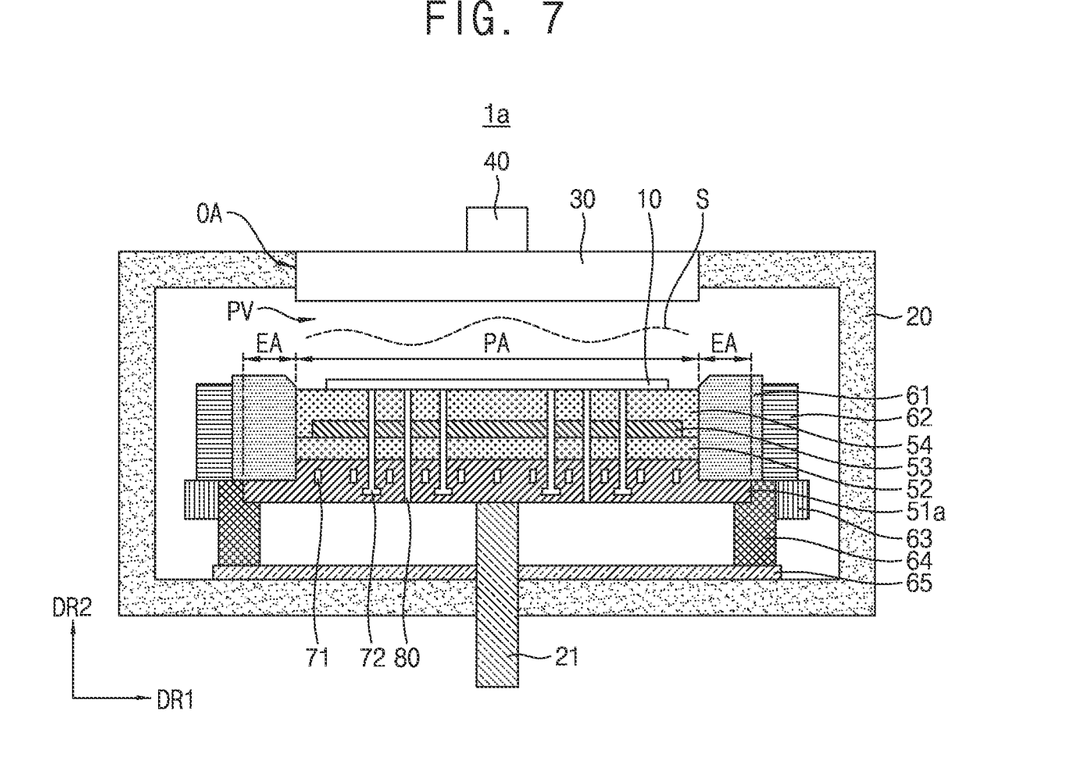
FIGS. 7 to 10 are views explaining a part of procedures of FIG. 6.

Operation S110 of measuring the plasma sheath using the reference lower electrode corresponds to an operation of measuring a plasma sheath S in the semiconductor processing equipment 1, using a reference lower electrode 51a. The reference lower electrode 51a (a first lower electrode 51a) may be the lower electrode 51 which has a flat upper surface. In accordance with embodiments, the reference lower electrode 51a may be an electrode separate from the lower electrode 51 constituting the substrate supporting structure 50. In operation S110 of measuring the plasma sheath using the reference lower electrode, it may be possible to measure the plasma sheath S through reference semiconductor processing equipment 1a provided with the reference lower electrode 51a.

Figure 8:
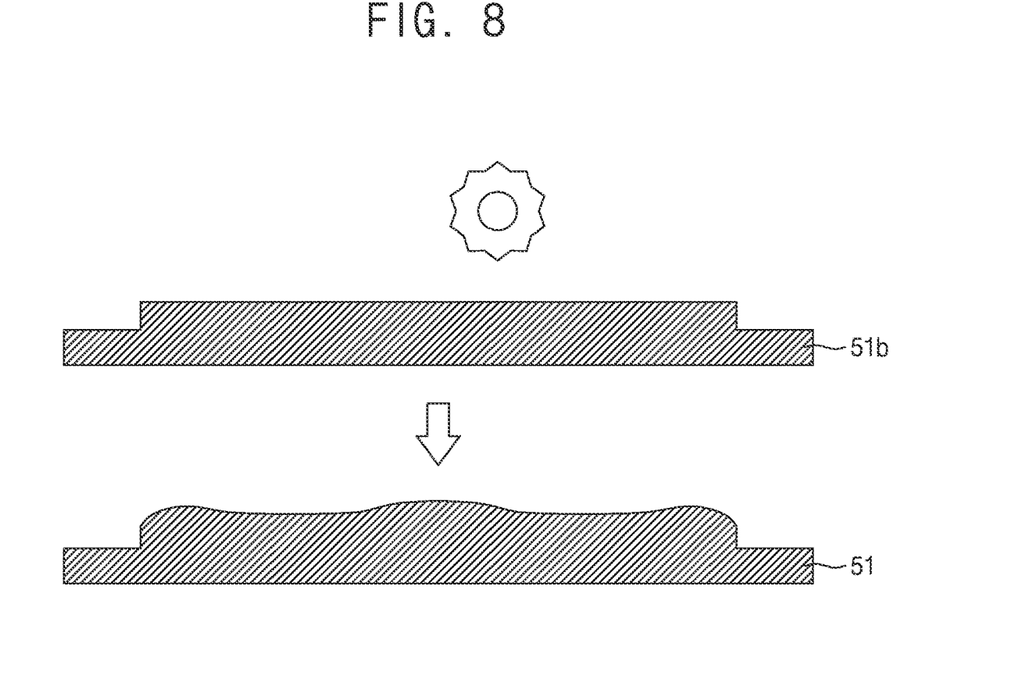

As shown in FIG. 8, operation S120 of polishing the upper surface of the lower electrode 51 such that the upper surface has a shape corresponding to the shape of the plasma sheath S corresponds to an operation of polishing an upper surface of a lower electrode 51*b* (a second lower electrode 51*b*). In an embodiment, the second lower electrode 51*b* may be an electrode different from the first lower electrode 51*a*. In an embodiment, the polishing may include a physical polishing process.

In an embodiment, the upper surface of the second lower electrode 51*b* may be polished such that the upper surface has a shape identical or very similar to the shape of the plasma sheath S. The polishing may be performed at an outside of the chamber 20, and the second lower electrode 51*b* in a completely polished state may be manufactured as the lower electrode 51 according to the exemplary embodiment of the disclosure.

Figure 9:
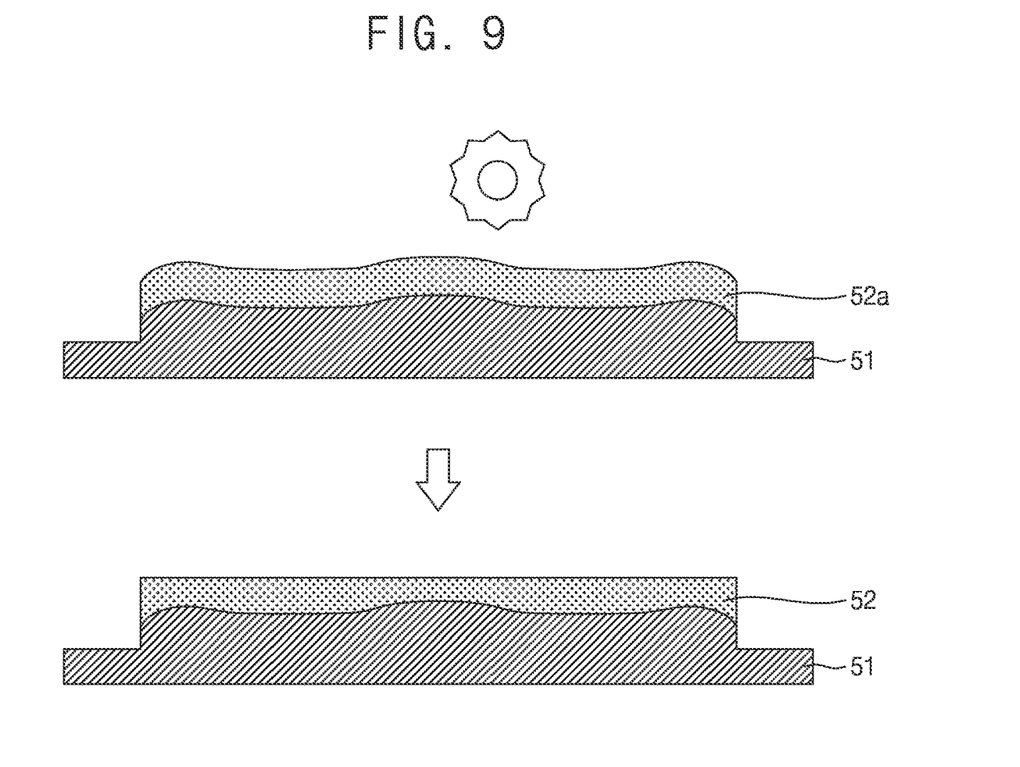

Operation S130 of forming the first plate corresponds to an operation of forming a first plate material 52*a* on the lower electrode 51, as shown in FIG. 9. Operation S140 of planarizing the upper surface of the first plate corresponds to an operation of polishing an upper surface of the first plate material 52*a* such that the upper surface becomes flat. The first plate 52, which has a flat upper surface, may be disposed on the lower electrode 51 through the first plate formation operation S130 and the planarization operation S140 for the upper surface of the first plate.

Figure 10:
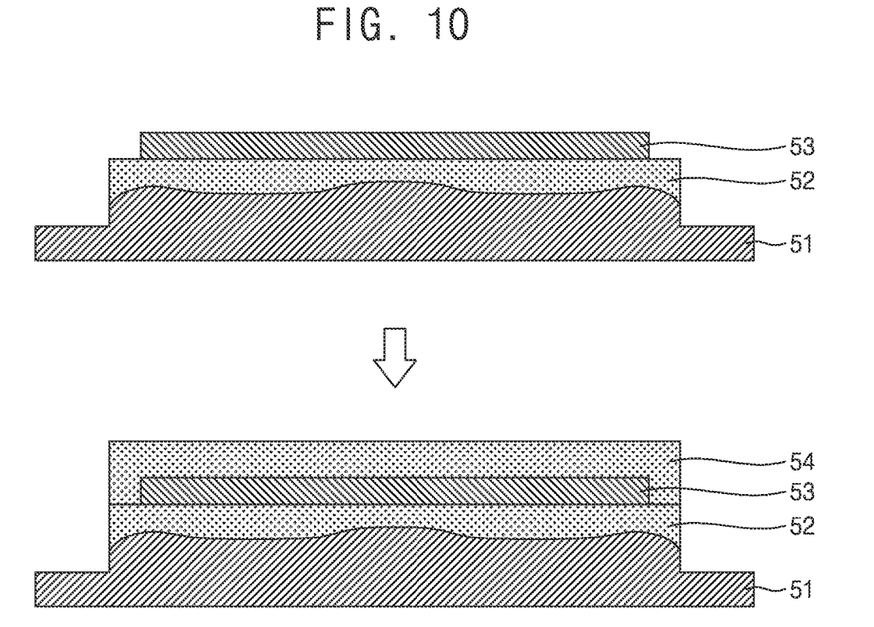

Thereafter, as shown in FIG. 10, the substrate supporting structure 50 may be manufactured through sequential execution of the attraction electrode formation operation S150 and the second plate formation operation S160.

Thereafter, the substrate supporting structure 50 manufactured as described above may be disposed in a chamber 20 of the reference semiconductor processing equipment 1*a* and, as such, the semiconductor processing equipment 1 may be manufactured. For example, the substrate supporting structure 50 manufactured as described above is substituted for the reference lower electrode 51*a*, the first plate 52, the attraction electrode 53 and the second plate 54 installed in the reference semiconductor processing equipment 1*a* and, as such, the semiconductor processing equipment 1 may be manufactured.

Hereinafter, semiconductor processing equipment according to another exemplary embodiment of the disclosure will be described. In the following description, no description will be given of constituent elements identical to those of FIGS. 1 to 10, and the constituent elements will be designated by reference numerals identical or similar to those of FIGS. 1 to 10.

Figure 11:
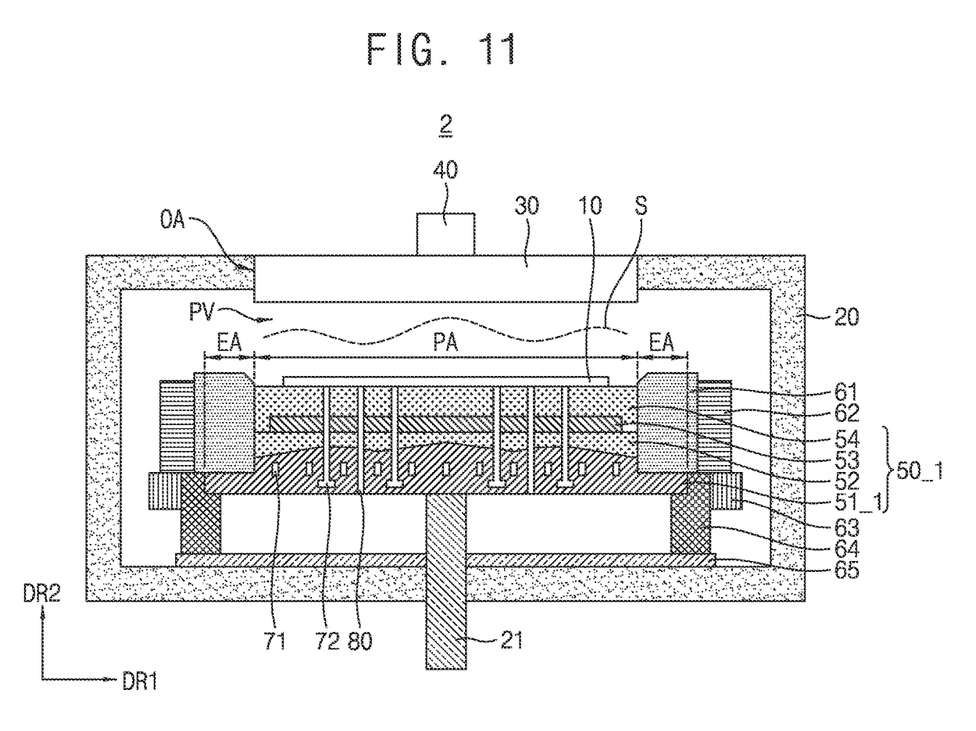
FIG. 11 is a schematic side view showing semiconductor processing equipment according to an exemplary embodiment of the disclosure.

FIG. 11 is a schematic side view showing semiconductor processing equipment according to an exemplary embodiment of the disclosure.

Referring to FIG. 11, semiconductor processing equipment 2 according to the exemplary embodiment of the disclosure differs from the semiconductor processing equipment 1 of FIG. 1 in that a substrate supporting structure 50_1 includes a lower electrode 51_1 having an upper surface with a shape different from that of the lower surface 51 in the semiconductor processing equipment 1.

The upper surface of the lower electrode 51_1 may be a set of planes having a predetermined tilt in a processing area PA. An angle may be formed between adjacent ones of the planes. In an embodiment, the tilt of each of the planes constituting the upper surface of the processing area PA may be 0.01 or less.

Figure 12:
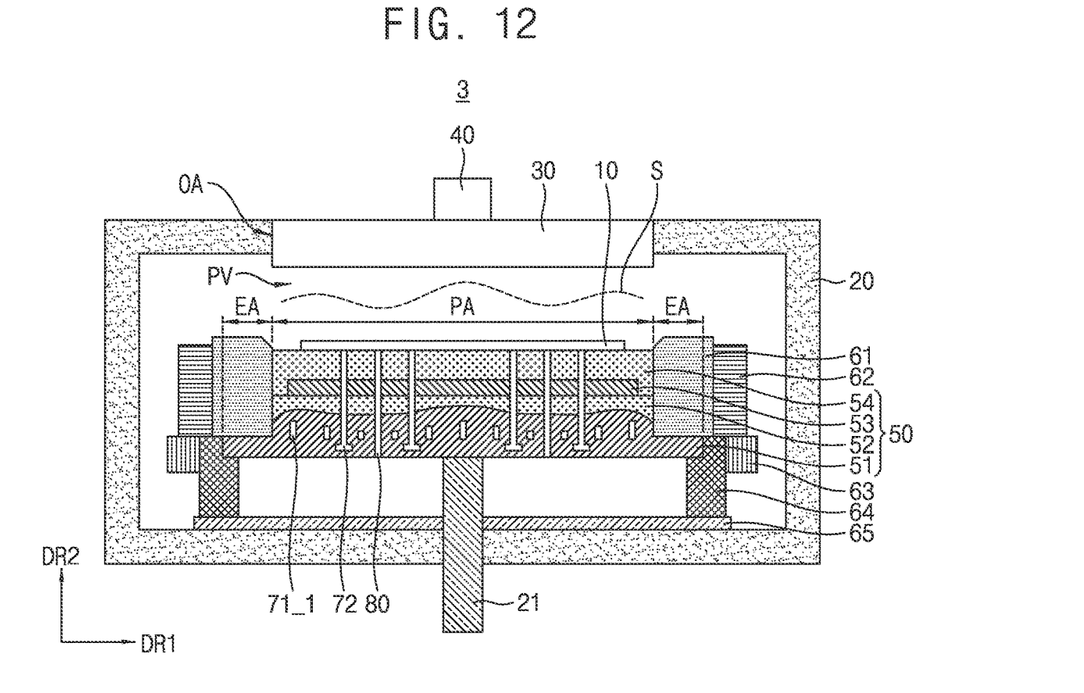
FIG. 12 is a schematic side view showing semiconductor processing equipment according to an exemplary embodiment of the disclosure.

FIG. 12 is a schematic side view showing semiconductor processing equipment according to an exemplary embodiment of the disclosure.

Referring to FIG. 12, semiconductor processing equipment 3 according to the exemplary embodiment of the disclosure differs from the semiconductor processing equipment 1 of FIG. 1 in that the semiconductor processing equipment 3 includes first channels 71_1 having different vertical widths. In an embodiment, the first channels 71_1 may have different vertical widths (heights or thicknesses) in accordance with positions thereof due to a curved shape of a processing area PA in a lower electrode 51. For example, the vertical width of each first channel 71_1 may be set to be proportional to a thickness of the lower electrode 51 at a position where the first channel 71_1 is disposed.

Figure 13:
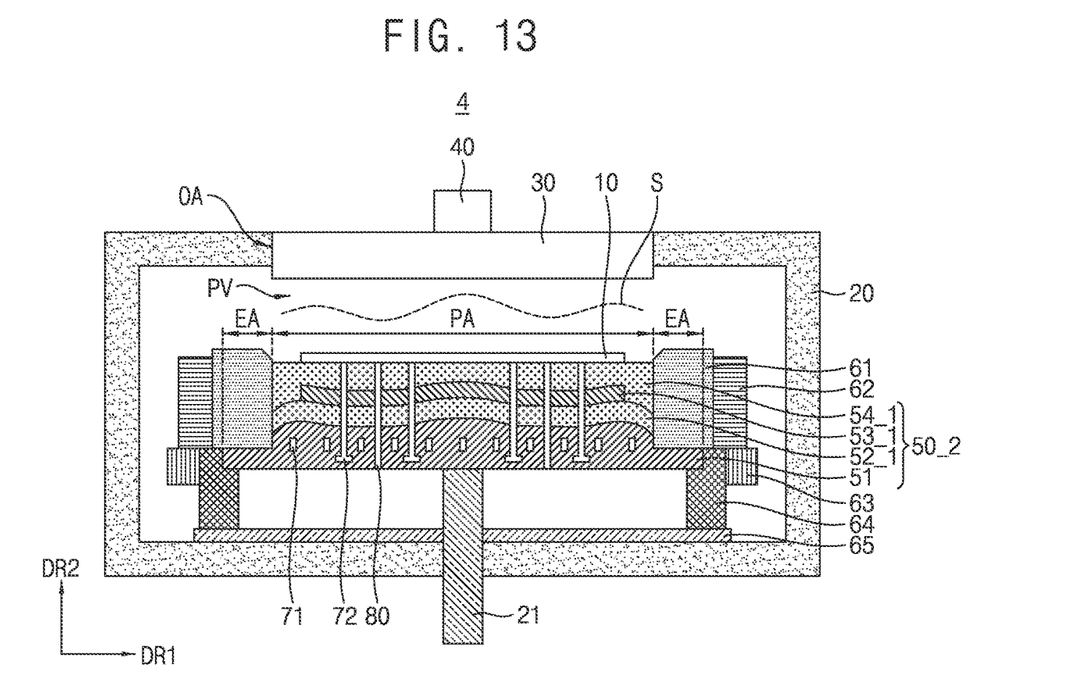
FIG. 13 is a schematic side view showing semiconductor processing equipment according to an exemplary embodiment of the disclosure.

FIG. 13 is a schematic side view showing semiconductor processing equipment according to an exemplary embodiment of the disclosure.

Referring to FIG. 13, semiconductor processing equipment 4 according to the exemplary embodiment of the disclosure differs from the semiconductor processing equipment 1 of FIG. 1 in that, in a substrate supporting structure 50_2, an upper surface of a first plate 52_1 thereof is curved, an attraction electrode 53_1 thereof is curved, and a lower surface of a second plate 54_1 thereof is curved corresponding to the attraction electrode 53_1.

In an embodiment, in a method for manufacturing the semiconductor processing equipment 4, operation S140 (FIG. 6) of planarizing the upper surface of the first plate 52_1 may be omitted. Accordingly, an upper surface of the second plate 54_1 may have a shape curved corresponding to the shape of the upper surface of the first plate 52_1 (a processing area PA). As such, the attraction electrode 53_1 may have a shape curved corresponding to the shape of the upper surface of the first plate 52_1. Accordingly, the lower surface of the second plate 54_1 may have a shape curved corresponding to the shape of the attraction electrode 53_1 and the shape of the upper surface of the first plate 52_1.

Figure 14:
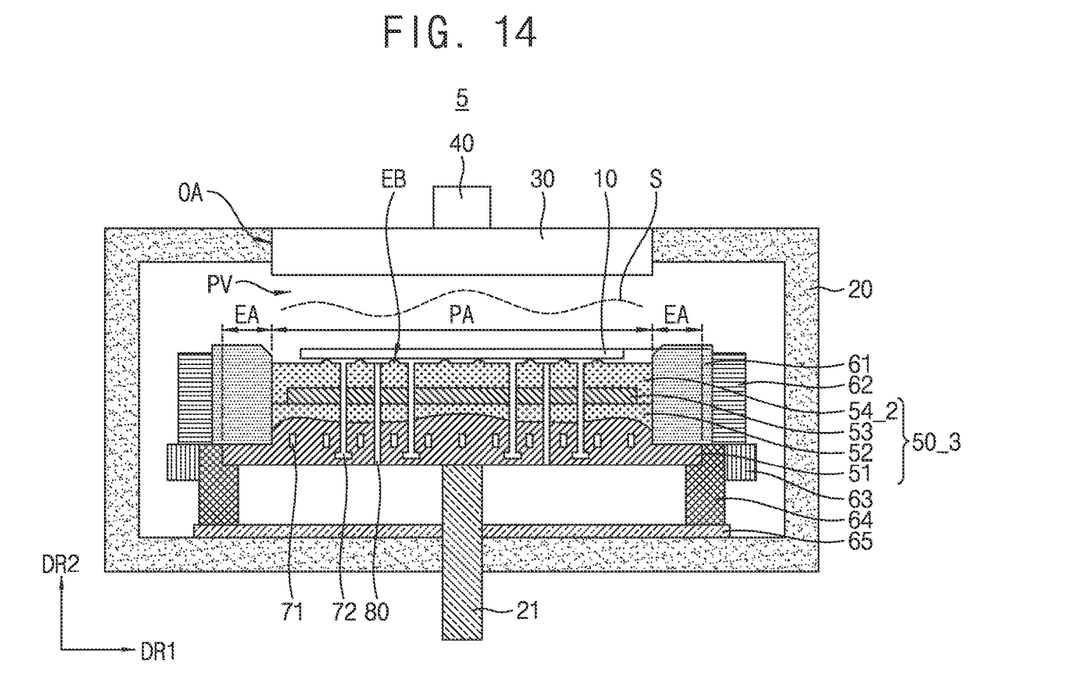
FIG. 14 is a schematic side view showing semiconductor processing equipment according to an exemplary embodiment of the disclosure.

FIG. 14 is a schematic side view showing semiconductor processing equipment according to an exemplary embodiment of the disclosure. Referring to FIG. 14, semiconductor processing equipment 5 according to the exemplary embodiment of the disclosure differs from the semiconductor processing equipment 1 of FIG. 1 in that an upper surface of a second plate 54_2 is not flat.

In an embodiment, embossing may be performed for the upper surface of the second plate 54_2. As such, the second plate 54_2 may include a plurality of protrusions EB at the upper surface thereof. A substrate 10 may be laid on the protrusions EB of the substrate supporting structure 50_3.

In accordance with the exemplary embodiments of the disclosure, ion tilting in plasma processing may be minimized.

As is traditional in the field, embodiments may be described and illustrated in terms of blocks which carry out a described function or functions. These blocks, which may be referred to herein as units or modules or the like, are physically implemented by analog and/or digital circuits such as logic gates, integrated circuits, microprocessors, microcontrollers, memory circuits, passive electronic components, active electronic components, optical components, hardwired circuits and the like, and may optionally be driven by firmware and/or software. The circuits may, for example, be embodied in one or more semiconductor chips, or on substrate supports such as printed circuit boards and the like. The circuits constituting a block may be implemented by dedicated hardware, or by a processor (e.g., one or more programmed microprocessors and associated circuitry), or by a combination of dedicated hardware to perform some functions of the block and a processor to perform other functions of the block. Each block of the embodiments may be physically separated into two or more interacting and discrete blocks without departing from the scope of the disclosure. Likewise, the blocks of the embodiments may be physically combined into more complex blocks without departing from the scope of the disclosure. An aspect of an embodiment may be achieved through instructions stored within a non-transitory storage medium and executed by a processor.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for purposes of limitation.

What is claimed is:

1. Semiconductor processing equipment comprising:
an upper electrode;
a gas supplier connected to the upper electrode; and
a substrate supporting structure spaced apart from the upper electrode, to define a processing volume, the substrate supporting structure supporting a substrate, wherein:
the substrate supporting structure includes:
a lower electrode comprising a side area disposed outside a step formed at an outer perimeter portion of the lower electrode and a processing area disposed inside the step;
a first plate disposed on the lower electrode;
an attraction electrode disposed on the first plate; and
a second plate disposed on the attraction electrode, the second plate supporting the substrate in a state in which the substrate is laid on an upper surface of the second plate,
each of the first plate and the second plate comprises ceramic,
an upper surface of the lower electrode is non-planar and has a maximum height aligned with a central portion of the processing area, and
the upper surface of the lower electrode comprises a first peak disposed at the central portion of the processing area, a second peak disposed outside the first peak, and a valley disposed between the first peak and the second peak, when viewed in cross-section.

2. The semiconductor processing equipment according to claim 1, wherein a height difference between the first peak and the valley is 0.2 mm or less.

3. The semiconductor processing equipment according to claim 1, wherein the lower electrode further comprises a first inflection point disposed between the first peak and the valley in the processing area, and a second inflection point disposed between the second peak and the valley in the processing area, when viewed in cross-section.

4. The semiconductor processing equipment according to claim 1, wherein the upper surface of the lower electrode is curved in an area overlapping with the processing area.

5. The semiconductor processing equipment according to claim 4, wherein a lower surface of the first plate is curved in the area overlapping with the processing area.

6. The semiconductor processing equipment according to claim 5, wherein the first plate has a minimum thickness at a central portion thereof.

7. The semiconductor processing equipment according to claim 1, wherein an upper surface of the lower electrode has a tilt of 0.01 or less in all portions of the processing area, wherein the tilt is a ratio between a change in height relative to a change in width of along the upper surface of the lower electrode.

8. The semiconductor processing equipment according to claim 1, wherein the substrate supporting structure comprises a plurality of channels configured to allow a refrigerant to flow therethrough.

9. The semiconductor processing equipment according to claim 8, wherein the plurality of channels has different vertical widths.

10. The semiconductor processing equipment according to claim 1, wherein a direction of an incidence vector of an ion incident upon the substrate after being injected from the upper electrode is a vertical direction.

11. The semiconductor processing equipment according to claim 1, wherein a shape of the upper surface of the lower electrode overlapping the processing area is identical to a shape of a plasma sheath generated in a semiconductor process.

12. The semiconductor processing equipment according to claim 1, wherein the substrate supporting structure supports the substrate at a position overlapping with the processing area.

13. An electrostatic chuck comprising:
a side area disposed outside a step formed at an outer perimeter portion; and
a processing area disposed inside the step while having a greater height than the side area, wherein:
an upper surface of the processing area has a tilt of 0.01 or less, wherein the tilt is a ratio between a change in height relative to a change in width of along the upper surface of the processing and
electric field vectors in different directions are generated in the processing area,
wherein the upper surface of the processing area comprises a first peak disposed at a central portion of the upper surface, a second peak disposed outside the first peak, and a valley disposed between the first peak and the second peak.

14. The electrostatic chuck according to claim 13, wherein the first peak has a greater height than the second peak.

15. The electrostatic chuck according to claim 14, wherein the upper surface of the processing area further comprises a first inflection point disposed between the first peak and the valley and a second inflection point disposed between the second peak and the valley.

16. The electrostatic chuck according to claim 14, wherein a height difference between the first peak and the valley is 0.2 mm or less.

17. The electrostatic chuck according to claim 13, wherein the processing area has a maximum height at a central portion thereof.

18. Semiconductor processing equipment comprising:
a chamber;
an upper electrode disposed at a top portion of the chamber;
a gas supplier connected to the upper electrode at an outside of the chamber;
a substrate supporting structure spaced apart from the upper electrode in the chamber to define a processing volume, the substrate supporting structure supporting a substrate;
a vertical rod disposed at a lower side of the substrate supporting structure, the vertical rod extending through a bottom portion of the chamber;
a focus ring disposed at an edge of the substrate supporting structure;
an upper edge ring disposed at an outer edge of the focus ring;

an isolator providing an electrical signal to the substrate supporting structure;
a lower edge ring disposed at a side of the isolator and a lower side of the upper edge ring; and
a ground plate connected to the isolator, wherein:
the substrate supporting structure includes:
   a lower electrode comprising a side area disposed outside a step formed at an outer perimeter portion of the lower electrode, and a processing area disposed inside the step;
   a first plate disposed on the lower electrode;
   an attraction electrode disposed on the first plate; and
   a second plate disposed on the attraction electrode, the second plate supporting the substrate in a state in which the substrate is laid on an upper surface of the second plate,
each of the first plate and the second plate comprises ceramic, and
an upper surface of the lower electrode is non-planar and has a maximum height aligned with a central portion of the processing area, and
the upper surface of the lower electrode comprises a first peak disposed at the central portion of the processing area, a second peak disposed outside the first peak, and a valley disposed between the first peak and the second peak, when viewed in cross-section.

* * * * *